(12) United States Patent
Okazaki et al.

(10) Patent No.: US 10,512,198 B2
(45) Date of Patent: Dec. 17, 2019

(54) POWER CONVERTER

(71) Applicant: CALSONIC KANSEI CORPORATION, Saitama-shi, Saitama (JP)

(72) Inventors: Fumihiro Okazaki, Saitama (JP); Gen Okuzuka, Saitama (JP); Yuuichirou Nomura, Saitama (JP); Masaharu Nagano, Saitama (JP)

(73) Assignee: CALSONIC KANSEI CORPORATION, Saitama-Shi (JP)

( * ) Notice: Subject to any disclaimer, the term of this patent is extended or adjusted under 35 U.S.C. 154(b) by 77 days.

(21) Appl. No.: 15/574,929

(22) PCT Filed: May 17, 2016

(86) PCT No.: PCT/JP2016/064566
§ 371 (c)(1),
(2) Date: Nov. 17, 2017

(87) PCT Pub. No.: WO2016/186102
PCT Pub. Date: Nov. 24, 2016

(65) Prior Publication Data
US 2018/0168075 A1 Jun. 14, 2018

(30) Foreign Application Priority Data

May 18, 2015 (JP) ................................. 2015-101035
Apr. 27, 2016 (JP) ................................. 2016-089218

(51) Int. Cl.
*H05K 7/20* (2006.01)
*H02J 7/02* (2016.01)
(Continued)

(52) U.S. Cl.
CPC .......... *H05K 7/20927* (2013.01); *H02J 7/022* (2013.01); *H02M 7/003* (2013.01);
(Continued)

(58) Field of Classification Search
CPC .......... H05K 7/20927; H05K 7/20272; H05K 5/0247; H05K 7/20263; H02J 7/022;
(Continued)

(56) References Cited

U.S. PATENT DOCUMENTS

2010/0072865 A1 3/2010 Endo et al.
2014/0098588 A1* 4/2014 Kaneko ................. H02M 7/003
363/141

(Continued)

FOREIGN PATENT DOCUMENTS

JP   H09-126617 A   5/1997
JP   2002-095267 A  3/2002
(Continued)

*Primary Examiner* — M Baye Diao
(74) *Attorney, Agent, or Firm* — Foley & Lardner LLP

(57) ABSTRACT

A power converter includes: a power module that converts direct-current electric power from a power storage apparatus and alternating-current electrical power to be supplied to a load; a charger that converts alternating-current electrical power supplied via an external connector to direct-current electric power and charges the power storage apparatus therewith; a case that accommodates the power module and the charger; a cooling-medium flow channel that is provided in the case and through which cooling medium flows, wherein the power module and the charger are arranged on the cooling-medium flow channel.

19 Claims, 14 Drawing Sheets

(51) Int. Cl.
*H02M 7/00* (2006.01)
*H05K 5/02* (2006.01)
*H02J 7/00* (2006.01)
H02P 27/06 (2006.01)
H02J 7/14 (2006.01)

(52) U.S. Cl.
CPC ....... *H05K 5/0247* (2013.01); *H05K 7/20263* (2013.01); *H05K 7/20272* (2013.01); *H02J 7/0042* (2013.01); *H02J 7/14* (2013.01); *H02P 27/06* (2013.01)

(58) Field of Classification Search
CPC .......... H02J 7/14; H02J 7/0042; H02M 7/003; H02P 27/06
USPC ....................................................... 320/109
See application file for complete search history.

(56) References Cited

U.S. PATENT DOCUMENTS

| | | | |
|---|---|---|---|
| 2015/0043132 A1 | 2/2015 | Miyashita et al. | |
| 2018/0301984 A1* | 10/2018 | Okazaki | B60L 53/20 |
| 2018/0339595 A1* | 11/2018 | Chang | B60L 11/1811 |

FOREIGN PATENT DOCUMENTS

| | | |
|---|---|---|
| JP | 2008-113540 A | 5/2008 |
| JP | 2012-528562 A | 11/2012 |
| JP | 2013-209078 A | 10/2013 |
| JP | 2014-091448 A | 5/2014 |
| WO | WO-2013/080665 A1 | 6/2013 |

\* cited by examiner

POWER CONVERTER

TECHNICAL FIELD

The present invention relates to a power converter mounted on electric automobiles, hybrid automobiles, and so forth.

BACKGROUND ART

JP2013-209078A discloses a power converter arranged above a driving motor generator in electric automobiles, hybrid automobiles, and so forth. This power converter is provided with a cooler that is arranged on an accommodating case for accommodating a power-module board and that cools the power-module board by circulating coolant liquid, which has been cooled in a radiator.

SUMMARY OF INVENTION

However, JP2013-209078A only describes that the power-module board is cooled by the cooler, and there is no description about a specific configuration of the cooler, such as a cooling mode, a relationship with other components, and so forth with regard to the power-module board.

An object of the present invention is to achieve cooling of a power converter with a cooling-medium flow channel having a simple configuration.

According to one aspect of the present invention, a power converter for converting electrical power between a power storage apparatus and a load includes: a power module configured to convert direct-current electric power from the power storage apparatus and alternating-current electrical power to be supplied to the load; a charger configured to convert alternating-current electrical power to direct-current electric power, the charger being configured to charge the power storage apparatus therewith, and the alternating-current electrical power being supplied via an external connector; a DC/DC converter provided between the power module and the charger, the DC/DC converter being configured to convert direct-current voltage supplied from the power storage apparatus; a case configured to accommodate the power module, the DC/DC converter, and the charger; and a cooling-medium flow channel through which cooling medium flows, the cooling-medium flow channel being provided in the case; wherein the power module, the DC/DC converter, and the charger are arranged on the cooling-medium flow channel, and the cooling medium flowing through the cooling-medium flow channel cools the power module, the DC/DC converter, and the charger in this order.

According to the above-mentioned aspect of the present invention, the power module and the charger are arranged above the cooling-medium flow channel. The power module is operated when a vehicle is driven, and in contrast, the charger is operated when the vehicle is stopped. And so, a situation in which the power module and the charger are operated at the same time and their temperatures become so high that cooling thereof is required is avoided. Thus, it is possible to cool both of the power module and the charger with the cooling medium flowing through the same cooling-medium flow channel. Therefore, it is possible to cool the power converter by the cooling-medium flow channel having a simple configuration.

DESCRIPTION OF EMBODIMENTS

A power converter 1 according to an embodiment of the present invention will be described below with reference to the drawings.

An overall configuration of the power converter 1 will be described first with reference to FIGS. 1 to 3.

Figure 1:
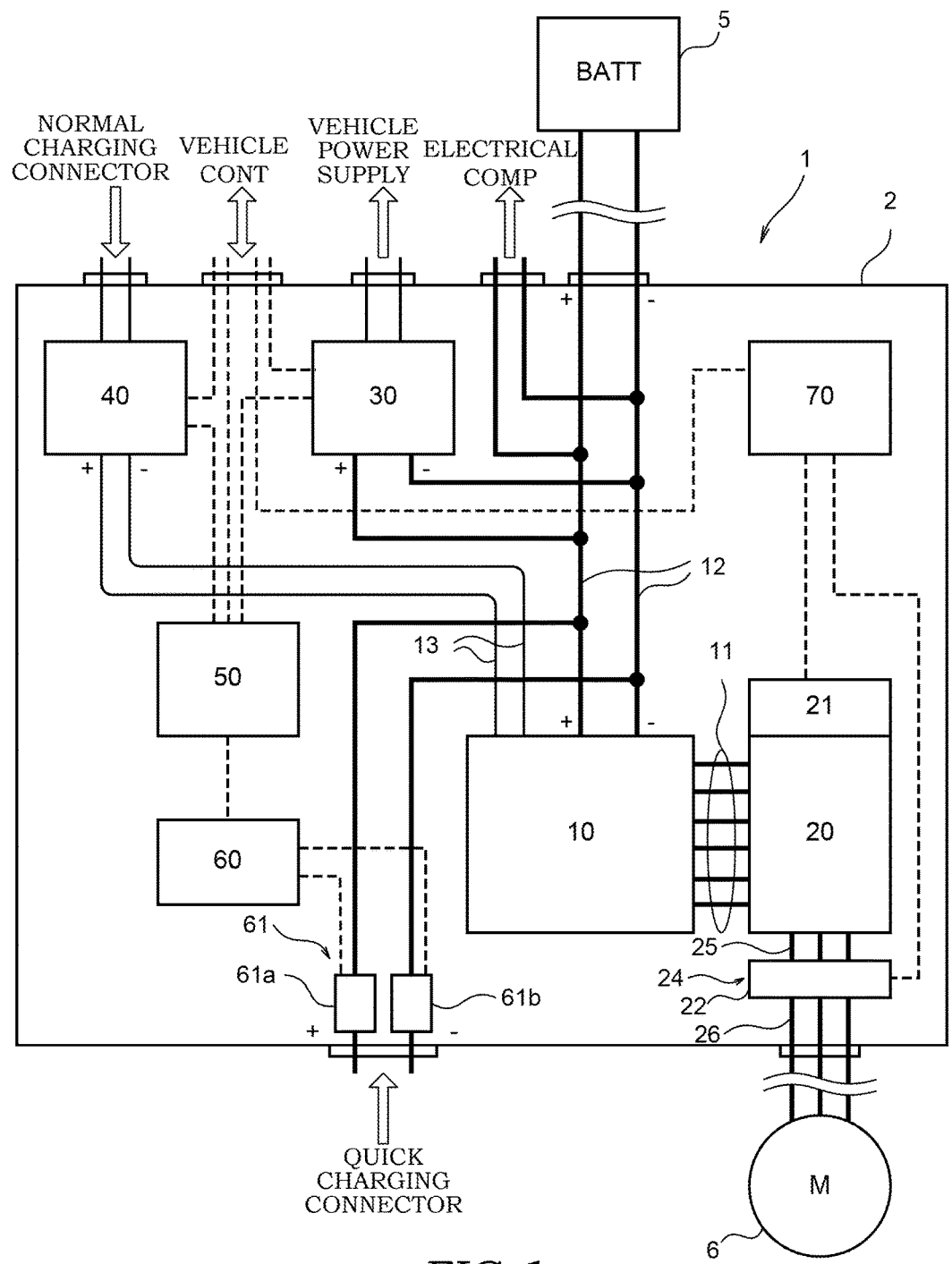
FIG. 1 is a block diagram for explaining a function of a power converter according to an embodiment of the present invention.

As shown in FIG. 1, the power converter 1 is provided in an electric automobile or a plug-in hybrid automobile (electric vehicle) and converts direct-current electric power from a battery (power storage apparatus) 5 to alternating-current electrical power suitable for driving of a motor generator (load) 6 as a dynamo-electric machine. The motor generator 6 is driven by electrical power supplied from the power converter 1.

The power converter 1 converts regenerative electrical power (alternating-current electrical power) from the motor generator 6 to direct-current electric power and charges the battery 5 therewith. In addition, the power converter 1 charges the battery 5 by supplying electrical power from an external charging connector (not shown) provided on a vehicle via a quick charging connector 63 or a normal charging connector 81.

The battery 5 is formed of, for example, a lithium ion secondary battery. The battery 5 supplies direct-current electric power to the power converter 1, and battery 5 is charged by direct-current electric power supplied by the power converter 1. The voltage of the battery 5 varies over a range of, for example, from 240 V to 400 V, and the battery 5 is charged by inputting higher voltage than this voltage.

The motor generator 6 is formed of, for example, a permanent magnet synchronous motor. The motor generator 6 is driven by alternating-current electrical power supplied from the power converter 1. When the vehicle is driven, the motor generator 6 rotationally drives a driving wheel of the vehicle (not shown). When the vehicle slows down, the motor generator 6 functions as a generator and generates regenerative electrical power.

Figure 2:
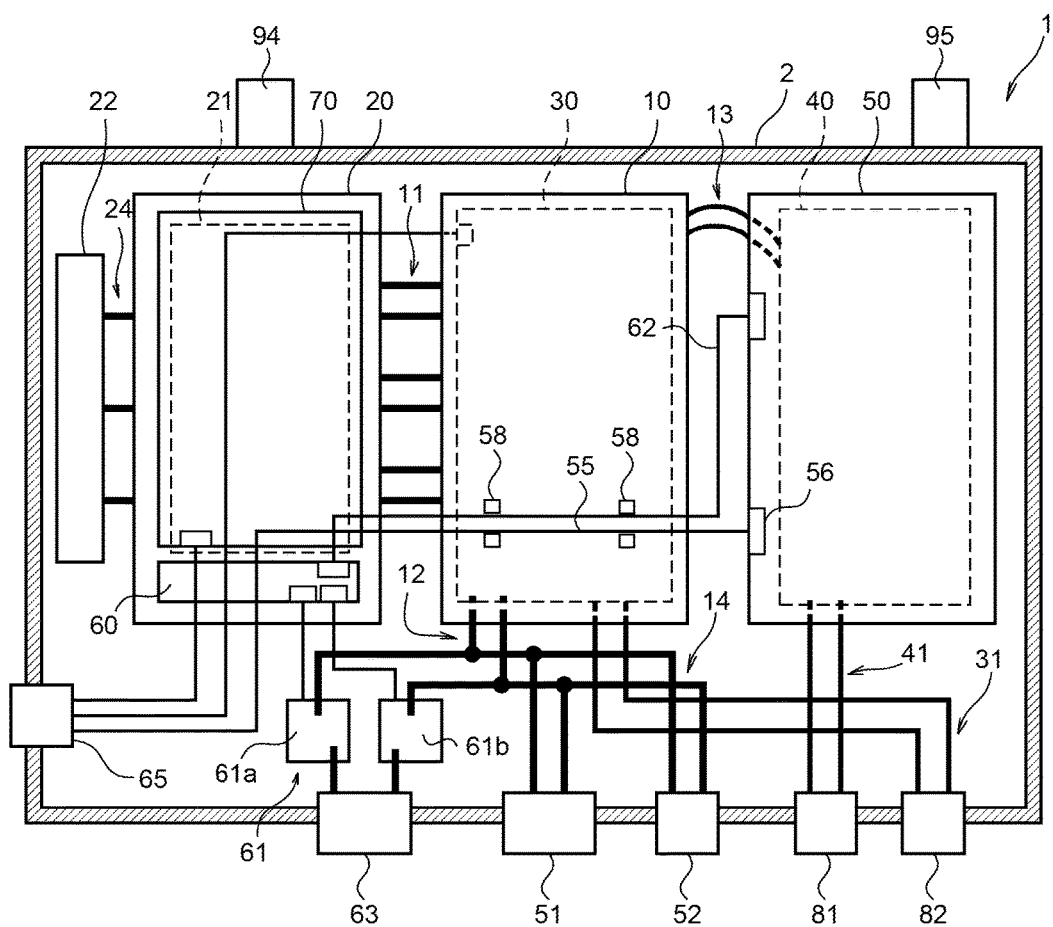
FIG. 2 is a sectional view in a horizontal plane for explaining the configuration of the power converter according to the embodiment of the present invention.
Figure 3:
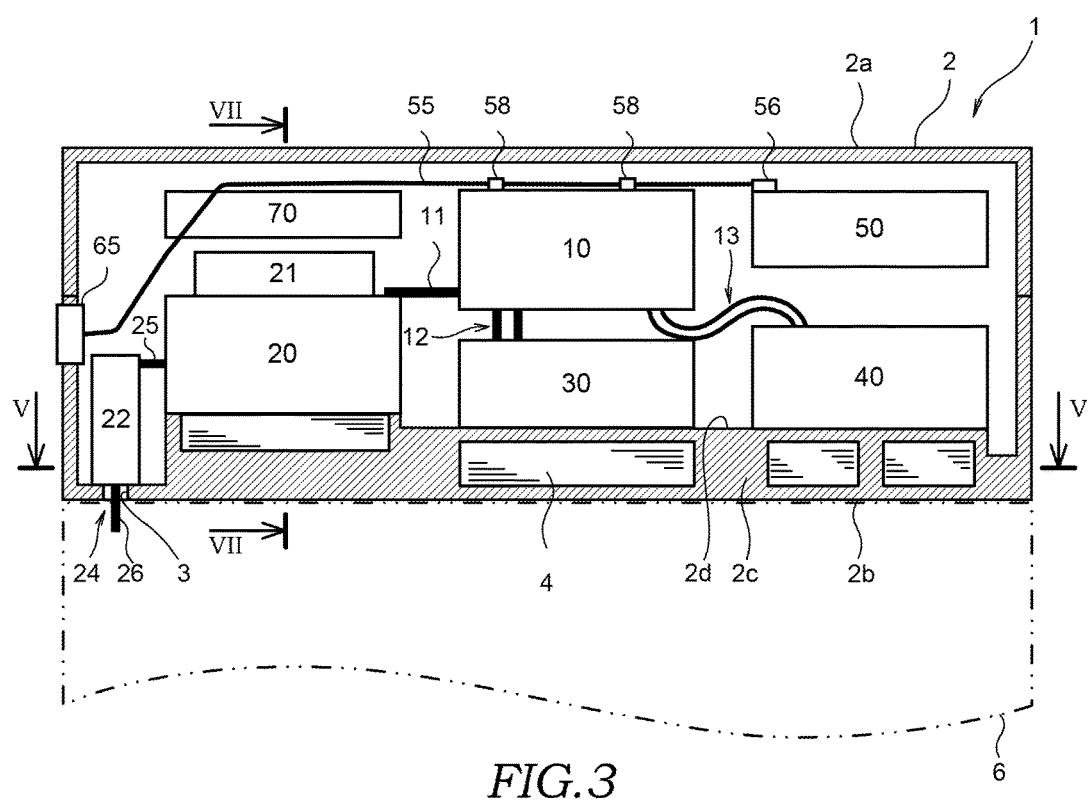
FIG. 3 is a sectional view from the side for explaining the configuration of the power converter according to the embodiment of the present invention.

As shown in FIGS. 2 and 3, the power converter 1 is provided with a box-shaped case 2 having a bottom portion (mounting portion) 2*c*. The power converter 1 includes, in the case 2, a capacitor module (smoothing capacitor) 10, a power module 20, a DC/DC converter 30, a charger 40, a DC/DC charge controller 50, and an inverter controller 70. These components are respectively electrically connected by bus bars or wirings.

As shown in FIG. 3, the case 2 is formed of a bottom case 2*b* having an opening in a top surface and of upper case 2*a* that closes the opening of the bottom case 2*b*. In the bottom case 2*b*, the power module 20, the DC/DC converter 30, and the charger 40 are provided so as to be in contact with a cooling surface 2*d* of the bottom portion 2*c*.

The bottom case 2*b* has a coolant-water flow channel (cooling-medium flow channel) 4. Coolant water (cooling medium) flows through the coolant-water flow channel 4. The coolant-water flow channel 4 is formed in the bottom portion 2*c*. The coolant water flowing through the coolant-water flow channel 4 cools the power module 20, the DC/DC converter 30, and the charger 40 that are mounted on the cooling surface 2*d* directly above the coolant-water flow channel 4. Detail of the coolant-water flow channel 4 will be described later with reference to FIGS. 4 to 9.

An external surface of the bottom portion 2*c* of the bottom case 2*b* faces the motor generator 6. The bottom portion 2*c* of the bottom case 2*b* has a through hole 3 through which an output bus bar (bus bar module) 24, which will be described later, is inserted. The through hole 3 is formed at a region of the bottom case 2*b* other than the region in which the coolant-water flow channel 4 is formed. Thus, compared with a case in which the through hole 3 is formed in the region in which the coolant-water flow channel 4 is formed, there is no need to provide a sealing etc. for the through hole 3, and therefore, it is possible to reduce the size of the bottom case 2*b* and to ensure sealing performance for the coolant water.

The capacitor module 10 is attached to the bottom case 2*b* so as to straddle over the DC/DC converter 30. In FIG. 3, leg parts of the capacitor module 10 to be attached to the bottom case 2*b* are omitted in the illustration. The capacitor module 10 is formed of a plurality of capacitor elements. The capacitor module 10 smoothes, for example, voltage of direct-current electric power supplied from the battery 5 and voltage of regenerative electrical power regenerated by the motor generator 6 via the power module 20. As described above, the capacitor module 10 performs removal of noise and suppression of voltage fluctuation by smoothing the voltage. The capacitor module 10 includes first bus bars 11, second bus bars 12, and electrical power wires 13.

The power module 20, the DC/DC converter 30, and the charger 40 are arranged around the capacitor module 10. Specifically, the capacitor module 10 is arranged between the power module 20 and the charger 40 in the case 2. The capacitor module 10 is layered over the DC/DC converter 30, and the DC/DC converter 30 is arranged below the capacitor module 10. The charger 40 is layered over the DC/DC charge controller 50, and the charger 40 is arranged below the DC/DC charge controller 50.

The first bus bars 11 project out towards the side from one side surface of the capacitor module 10 and are connected to the power module 20. The power module 20 are connected to the first bus bars 11 directly by using screws, etc. The second bus bars 12 are connected to the DC/DC converter 30, relays 61, the battery 5, and electric compressor (not shown) (see FIG. 1). The electrical power wires 13 are connected to the charger 40. The first bus bars 11, the second bus bars 12, and the electrical power wires 13 share the positive electrode and the negative electrode in the capacitor module 10.

The second bus bars 12 project downwards from a bottom surface of the capacitor module 10. The second bus bars 12 are connected, by using screws, directly to the DC/DC converter 30 that is arranged so as to be layered below the capacitor module 10. The second bus bars 12 are connected to a positive-side relay 61*a* and a negative-side relay 61*b*.

As shown in FIG. 2, the second bus bars 12 are respectively connected via bus bars 14 to a battery-side connector 51 connected to the battery 5 and a compressor-side connector 52 connected to an electric compressor.

The electrical power wires 13 are extended from the side surface of the capacitor module 10 opposite from the first bus bars 11 towards the side. The electrical power wires 13 are flexible cables having bendability and are connected to the charger 40. The charger 40 are connected to the normal charging connector 81 via bus bars 41.

A signal line connector 65 allows connection between the outside of the case 2 and signal line 55 connected to the DC/DC converter 30, the charger 40, the DC/DC charge controller 50, and the inverter controller 70.

The signal line 55 connects the signal line connector 65 and the DC/DC charge controller 50. The signal line 55 is connected to a connector 56 of the DC/DC charge controller 50 by extending through a top surface of the capacitor module 10 together with a signal line 62 provided from the DC/DC charge controller 50 to a relay controller 60. A plurality of guide parts 58 for supporting the signal line 55 and the signal line 62 are formed on the top surface of the capacitor module 10.

The power module 20 has a plurality of power elements (not shown). The power module 20 performs ON/OFF control of the power elements, thereby mutually converting direct-current electric power from the battery 5 and alternating-current electrical power from the motor generator 6. The ON/OFF control of the plurality of power elements is performed by a drive substrate 21 provided in the power module 20. The drive substrate 21 is layered on a top surface of the power module 20. The inverter controller 70 and the relay controller 60 are arranged above the drive substrate 21.

The power module 20 is connected to the first bus bars 11 of the capacitor module 10. The first bus bars 11 are formed of three pairs of bus bars each pair of which forms the positive electrode and the negative electrode. Three-phase output bus bars 24 formed of a U-phase, a V-phase, and a W-phase are connected to the power module 20.

As shown in FIG. 3, the output bus bars 24 have power module terminals 25 connected to the power module 20, motor terminals (load terminals) 26 connected to the motor generator 6, and a current sensor 22 that detects electric current through the output bus bars 24. The output bus bars 24 are connected to the side surface of the power module 20 opposite from the first bus bars 11. The output bus bars 24 are respectively connected to the U-phase, the V-phase, and the W-phase of the power module 20 directly, and output three-phase alternating-current electrical power to the motor generator 6.

In the output bus bars 24, the power module terminals 25 and the motor terminals 26 are formed in mutually crossing directions. Specifically, the motor terminals 26 are connected to the motor generator 6 arranged below the output bus bars 24. The power module terminals 25 are connected to the power module 20 arranged on the side of the output bus bars 24. Thus, the motor terminals 26 are formed so as to extend in the crossing direction with respect to the power module terminals 25 at the right angle.

The output bus bars 24 are accommodated in the case 2. Tip ends of the motor terminals 26 are inserted into the through hole 3 of the bottom portion 2c of the case 2 and exposed to the outside. With such a configuration, the motor terminals 26 can be connected via harnesses, etc. (not shown) to the motor generator 6.

As described above, because the case 2 accommodating the power module 20 and the output bus bars 24 has the through hole 3 through which the output bus bars 24 is inserted, simply by assembling the power module 20 and the output bus bars 24 to the case 2 from which the upper case 2a is detached, the output bus bars 24 is inserted into the through hole 3 and is projected out from the case 2. Therefore, because there is no need to turn over the case 2, it is possible to improve workability upon assembly of the power converter 1.

As shown in FIG. 1, the inverter controller 70 outputs to the drive substrate 21 a signal for operating the power module 20 on the basis of an instruction from a controller (not shown) of the vehicle and detection result of the electric current of the U-phase, the V-phase, and the W-phase from the current sensor 22. The drive substrate 21 controls the power module 20 on the basis of the signal from the inverter controller 70. An inverter module that mutually converts direct-current electric power and alternating-current electric power is formed of the inverter controller 70, the drive substrate 21, the power module 20, and the capacitor module 10.

As shown in FIG. 2, the DC/DC converter 30 is provided so as to face the output bus bars 24 such that the power module 20 is sandwiched therebetween. The DC/DC converter 30 is connected to a vehicle-side connector 82 via bus bars 31. The vehicle-side connector 82 is connected to harnesses, etc. for supplying direct-current power supply output from the DC/DC converter 30 to respective parts of the vehicle.

The DC/DC converter 30 converts, when the vehicle is driven (when the power module 20 is driven) or stopped, voltage of direct-current electric power supplied from the battery 5 and supplies it to other devices. The DC/DC converter 30 steps down voltage of direct-current electric power from the battery 5 (for example, 400 V) to 12 V direct-current electric power. Direct-current electric power voltage of which has been stepped down is supplied as a power supply to a controller, lighting, fan, and so forth mounted on the vehicle. The DC/DC converter 30 is connected to the capacitor module 10 and the battery 5 via the second bus bars 12.

The charger 40 is provided so as to face the power module 20 such that the DC/DC converter 30 is sandwiched therebetween. The charger 40 converts commercial power supply (for example, AC 100 V or 200 V), which is supplied from the external charging connector provided in the vehicle via the normal charging connector 81, to direct-current electric power (for example, 500 V). Direct-current electric power converted by the charger 40 is supplied from the electrical power wires 13 to the battery 5 via the capacitor module 10. With such a configuration, the battery 5 is charged.

The DC/DC charge controller 50 controls driving of the motor generator 6 and charging of the battery 5 by the power converter 1. Specifically, on the basis of the instruction from the controller of the vehicle, the DC/DC charge controller 50 controls the charging of the battery 5 by the charger 40 via the normal charging connector 81, charging of the battery 5 via a quick charging connector 63, and the driving of the motor generator 6.

The relay controller 60 is controlled by the DC/DC charge controller 50 and controls on/off of the relays 61. The relays 61 are composed of the positive-side relay 61a and the negative-side relay 61b. The relays 61 allows connection when the external charging connector provided in the vehicle is connected via the quick charging connector 63 and supplies direct-current electric power (for example 500 V) supplied from the quick charging connector 63 to the second bus bars 12. The battery 5 is charged by direct-current electric power thus supplied.

With the power converter 1 configured as described above, the power module 20, the DC/DC converter 30, and the charger 40 are arranged so as to be adjacent to the capacitor module 10 and are connected by the first bus bars 11, the second bus bars 12, and the electrical power wires 13, respectively. Thus, the distances between the capacitor module 10 and each of the power module 20, the DC/DC converter 30, and the charger 40 can be made shorter. Therefore, it is possible to reduce resistance (R[0]) and inductance (L[H]) on the path of direct-current electric power and to reduce electrical power loss.

In addition, the capacitor module 10 is arranged between the power module 20 and the charger 40 that generate large amount of heat. Thus, it is possible to suppress mutual influence by the heat between the power module 20 and the charger 40. Especially, because operation of the power module 20 (power running and regeneration of the motor generator 6) and operation of the charger 40 (charging of the battery 5 by an external connector connected via the normal charging connector 81) are not performed at the same time, it is possible to eliminate influence by the heat between the operations.

Next, a specific configuration of the coolant-water flow channel 4 will be described with reference to FIGS. 4 to 9.

Figure 4:
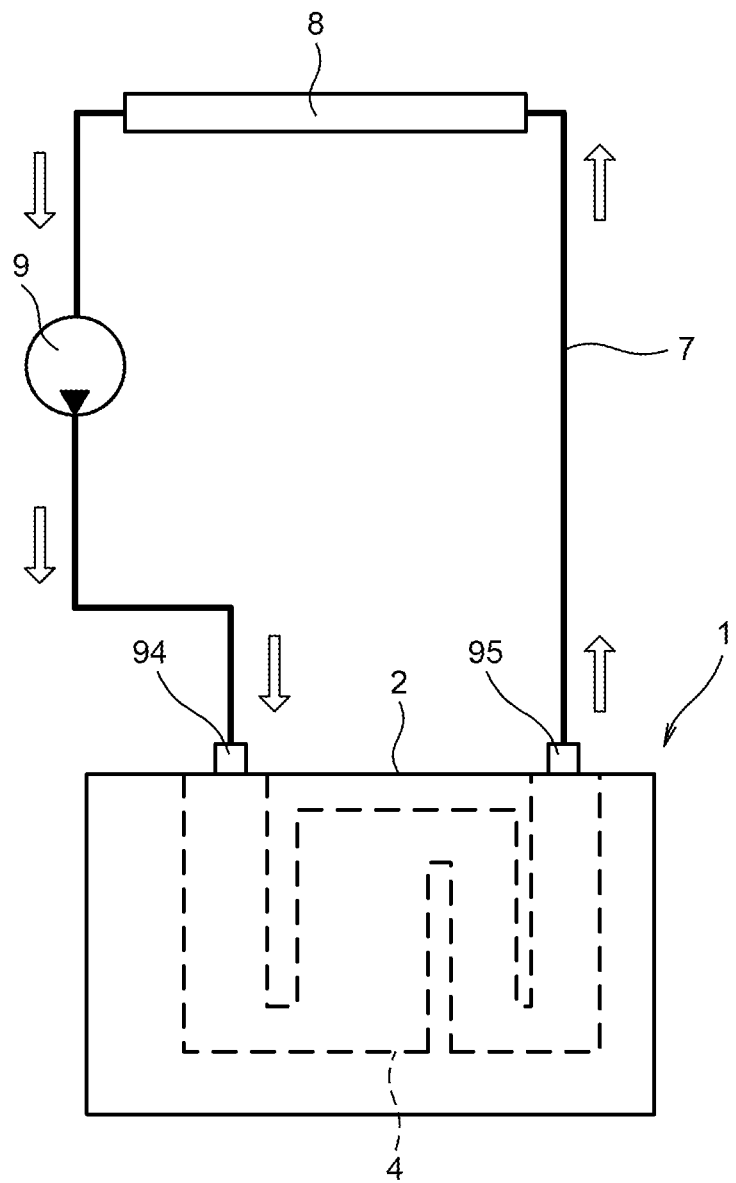
FIG. 4 is a configuration diagram for explaining a circulation flow channel of cooling medium.

As shown in FIG. 4, the coolant water is discharged from the coolant-water flow channel 4 to a circulation flow channel 7 via a discharge flow channel 95, which will be described later. The coolant water that has been discharged to the circulation flow channel 7 is cooled by a sub-radiator 8 that is provided in the most front part of the vehicle. The coolant water that has been cooled by the sub-radiator 8 is supplied to the coolant-water flow channel 4 through a supply flow channel 94. A water pump 9 that circulates the coolant water through the circulation flow channel 7 and the coolant-water flow channel 4 is provided between the sub-radiator 8 and the supply flow channel 94 in the circulation flow channel 7.

Figure 5:
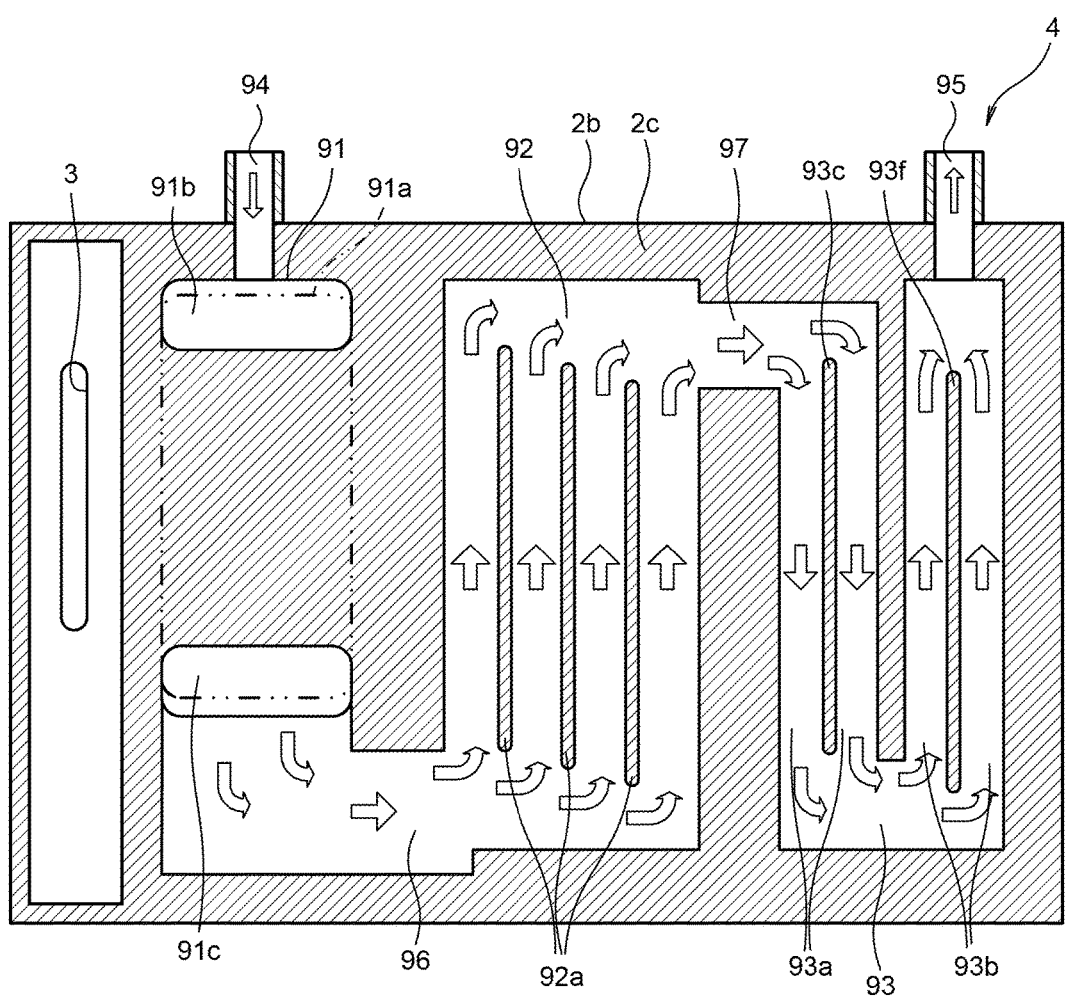
FIG. 5 is a diagram for explaining the cooling-medium flow channel, and is a schematic view of a cross-section taken along the line V-V in FIG. 3.
Figure 6:
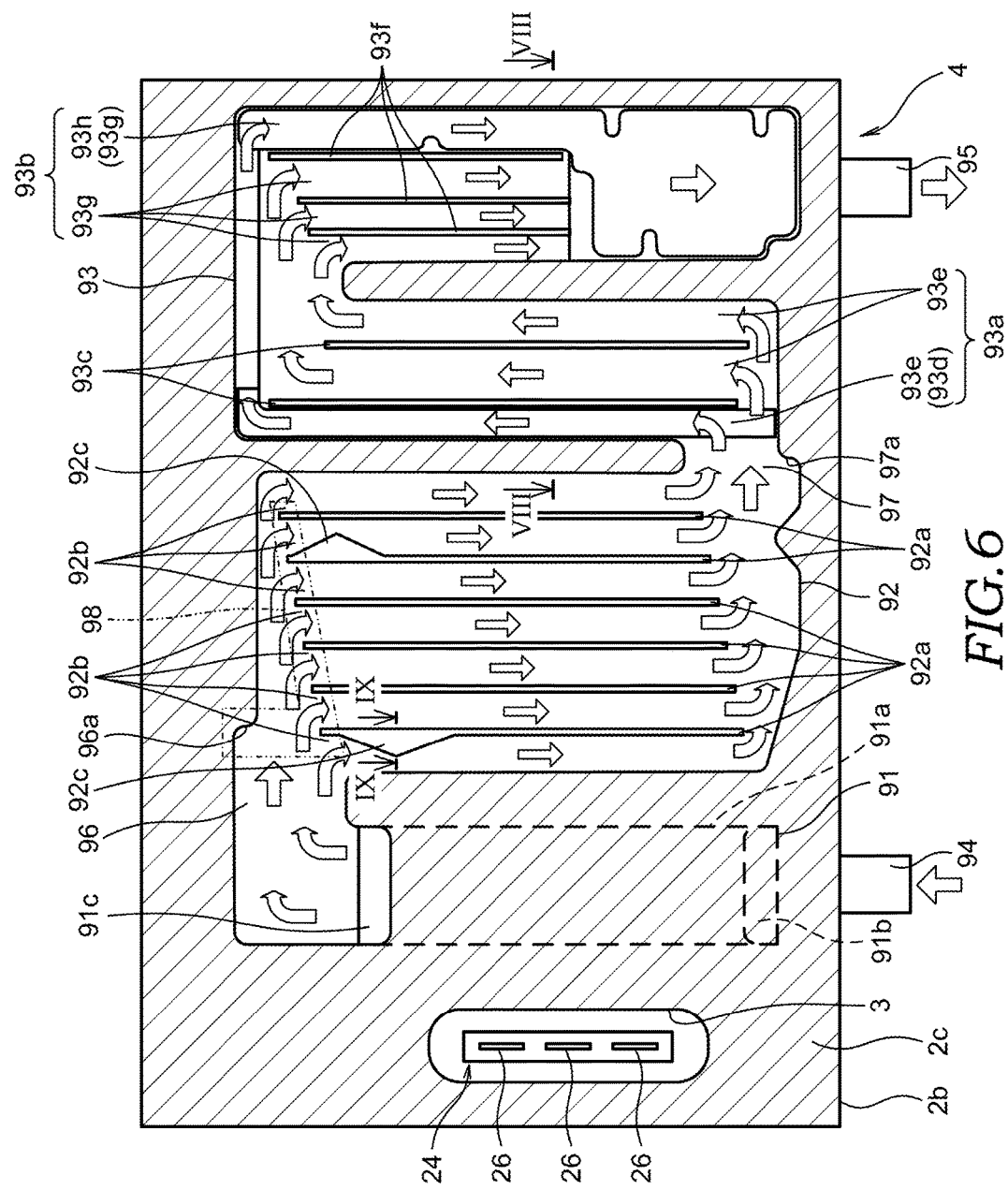
FIG. 6 is a diagram for more specifically explaining the configuration of the cooling-medium flow channel shown in FIG. 5, and is a diagram of the cooling-medium flow channel viewed from the bottom surface side in FIG. 5.

As shown in FIGS. 5 and 6, the coolant-water flow channel 4 has a power-module cooling portion (first cooling portion) 91 formed along the power module 20, a DC/DC-converter cooling portion (second cooling portion) 92 formed along the DC/DC converter 30, and a charger cooling portion (third cooling portion) 93 formed along the charger 40. In these figures, the power module 20 corresponds to a first power conversion device, and the DC/DC converter 30 and the charger 40 correspond to second power conversion devices. In addition, the second power conversion device and the capacitor module 10 correspond to low-heat-generating electrical devices. In addition, the power-module cooling portion 91 corresponds to the first-power-conversion-device cooling portion, and the DC/DC-converter cooling portion 92 and the charger cooling portion 93 correspond to low-heat-generating-electrical-device cooling portions.

In addition, the coolant-water flow channel 4 has a first connecting portion (connecting flow channel) 96 that connects the power-module cooling portion 91 and the DC/DC-converter cooling portion 92 and a second connecting portion 97 that connects the DC/DC-converter cooling portion 92 and the charger cooling portion 93. The power-module cooling portion 91, the DC/DC-converter cooling portion 92, and the charger cooling portion 93 are arranged in the coolant-water flow channel 4 in series via the first connecting portion 96 and the second connecting portion 97.

The case 2 is provided with the supply flow channel 94 that supplies the coolant water to the power-module cooling portion 91 from the outside and the discharge flow channel 95 that discharges the coolant water from the charger cooling portion 93 to the outside. The power converter 1 is arranged such that the supply flow channel 94 and the discharge flow channel 95 face the forward direction of the vehicle. With such a configuration, the distance between the sub-radiator 8 (see FIG. 4) and the coolant-water flow channel 4 can be made the shortest.

The coolant water flowing through the coolant-water flow channel 4 is supplied from the supply flow channel 94, cools the power module 20, cools the DC/DC converter 30, cools the charger 40, and thereafter, is discharged to the outside from the discharge flow channel 95. As described above, the coolant-water flow channel 4 is a single flow channel that is arranged in series between the supply flow channel 94 and the discharge flow channel 95.

The coolant-water flow channel 4 is formed such that the DC/DC-converter cooling portion 92 that cools the DC/DC converter 30 and the charger cooling portion 93 that cools the charger 40 have larger flow-channel cross-sectional area (the cross-sectional area perpendicular to the flow direction of the coolant water) as compared to the power-module cooling portion 91 that cools the power module 20. In other words, the flow speeds of the coolant water in the DC/DC-converter cooling portion 92 and the charger cooling portion 93 are slower than the flow speed of the coolant water in the power-module cooling portion 91. The flow-channel cross-sectional area is the area of the cross-section perpendicular to the flow direction of the coolant water, and the flow-channel cross-sectional area can be increased by, for example, increasing width and/or depth of the flow channel.

As described above, in the coolant-water flow channel 4, the flow-channel cross-sectional areas of a portion for cooling the DC/DC converter 30 and a portion for cooling the charger 40 are larger than that of a portion for cooling the power module 20. And so, in the coolant-water flow channel 4, the flow speed of the coolant water in the portion for cooling the power module 20 is faster, and the flow speeds of the coolant water in the portion for cooling the DC/DC converter 30 and the portion for cooling the charger 40 are slower. As a result, while cooling the power module 20 with reliability, it is possible to suppress the increase in pressure loss at a portion in which the flow speed of the coolant water is slow. Therefore, in a case in which a plurality of devices are cooled with the same coolant water, it is possible to suppress pressure loss while ensuring cooling capacity.

Here, the DC/DC converter 30 may be operated at the same time as the power module 20 and the charger 40. Specifically, when the power module 20 is operated, the DC/DC converter 30 supplies 12V direct-current power supply to a controller, lighting, fan, and so forth provided in the vehicle. Similarly, when the charger 40 is operated, the DC/DC converter 30 supplies 12V direct-current power supply to a controller, lighting, fan, and so forth provided in the vehicle.

However, the amount of heat generated by the DC/DC converter 30 is smaller than those generated by the power module 20 and the charger 40. Thus, even when the DC/DC converter 30 is arranged on the single coolant-water flow channel 4 that cools the power module 20 and the charger 40, the cooling efficiency of the power converter 1 is not affected. In other words, as compared with the power module 20 and the charger 40, the DC/DC converter 30 generates heat so as to become mild temperature. In this embodiment, the flow speed of the coolant water in the portion for cooling the DC/DC converter 30 is intentionally set to the slowest, and thereby, the increase in pressure loss due to cooling of the plurality of devices is suppressed. With such a configuration, it is possible to suppress the increase in output (the increase in size) of the water pump 9.

In addition, because the power module 20, the DC/DC converter 30, and the charger 40 can be cooled by the coolant water flowing through the same coolant-water flow channel 4, it is only required to provide a single circulation flow channel 7 to introduce the coolant water to the coolant-water flow channel 4. Thus, there is no need to respectively provide flow channels for introducing the coolant water to the power module 20, the DC/DC converter 30, and the charger 40.

In addition, the power module 20 and the charger 40 are arranged on single coolant-water flow channel 4. However, the power module 20 is operated when the vehicle is driven (when the motor generator 6 is driven), and in contrast, the charger 40 is operated when the vehicle is stopped. And so, a situation in which the power module 20 and the charger 40 are operated at the same time and their temperatures become so high that cooling thereof is required is avoided. Thus, a situation in which the coolant water for cooling the charger 40 has already been heated to high temperature by the cooling of the power module 20 is avoided. Therefore, because both of the power module 20 and the charger 40 can be cooled by the coolant water flowing through the same coolant-water flow channel 4, it is possible to release the heat of the power converter 1 with single circulation flow channel 7 and to simplify the configuration of the coolant-water flow channel 4.

Here, when the power module 20 and the charger 40 are compared, because the charger 40 generates less heat, in the coolant-water flow channel 4, the flow speed is set to be slower in the charger cooling portion 93 relative to that in the power-module cooling portion 91. With such a configuration, the increase in pressure loss is suppressed. In this embodiment, the flow-channel cross-sectional areas of the power-module cooling portion 91, the charger cooling portion 93, and the DC/DC-converter cooling portion 92 become larger in this order, and the flow speeds of the coolant water flowing through respective components become slower in the same order.

Details of the power-module cooling portion 91, the DC/DC-converter cooling portion 92, and the charger cooling portion 93 will be respectively described below.

Figure 7:
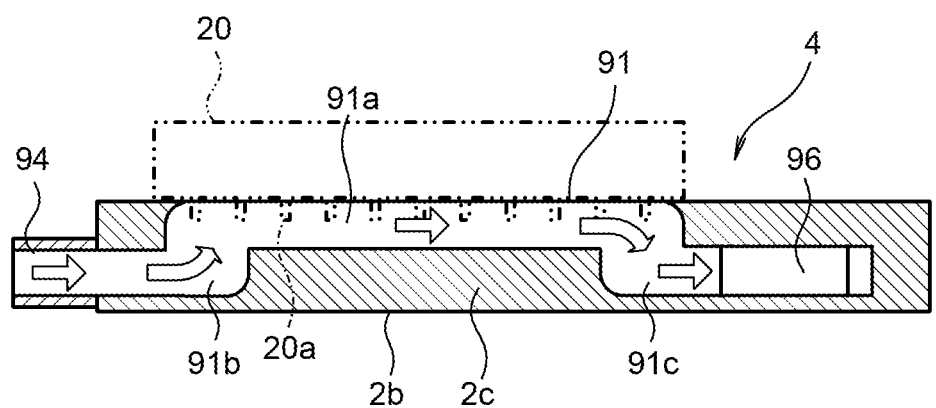
FIG. 7 is a diagram for explaining the cooling-medium flow channel, and is a sectional view taken along the line VII-VII in FIG. 3.
Figure 8:
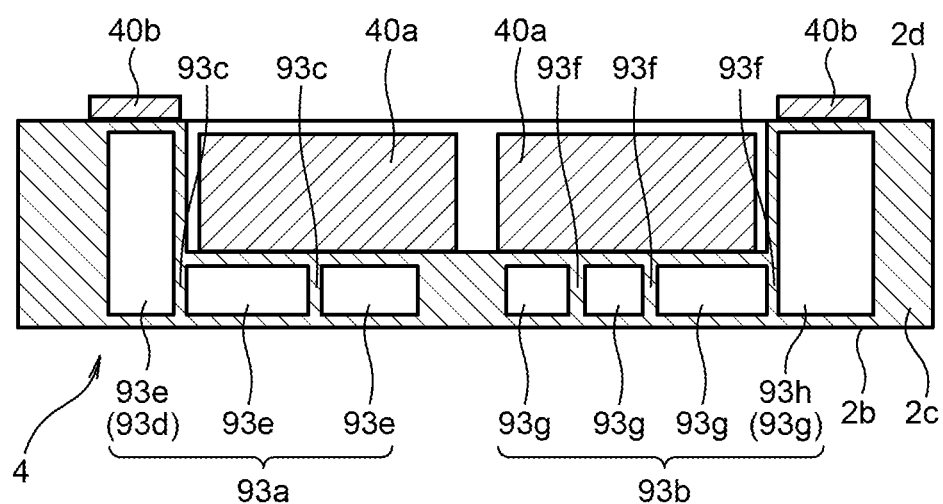
FIG. 8 is a diagram for explaining the configuration of a charger cooling portion, and is a sectional view taken along the line VIII-VIII in FIG. 6.

As shown in FIG. 7, the power-module cooling portion 91 has an upper cooling portion 91a that is formed to have an opening at the surface facing the power module 20 and that directly cools the power module 20 by the coolant water flowing therethrough, an up-flow connecting portion 91b that introduces the coolant water that has been supplied from the supply flow channel 94 to the upper cooling portion 91a provided at a higher level than the up-flow connecting portion 91b, and a down-flow connecting portion 91c that introduces the coolant water that has flown through the upper cooling portion 91a to the DC/DC-converter cooling portion 92 provided at a lower level than the upper cooling portion 91a. Here, the flow-channel cross-sectional area of the power-module cooling portion 91 is the cross-sectional area of the flow channel through which the coolant water for cooling the power module 20 flows and is the cross-sectional area of the upper cooling portion 91a.

As shown in FIGS. 5 and 6, the flow-channel area of the supply flow channel 94 is smaller than the flow-channel area of the power-module cooling portion 91. However, the coolant water that has been supplied from the supply flow channel 94 spreads fully in the width direction of the power-module cooling portion 91 (the left-right direction in FIGS. 5 and 6) as it hits a wall portion of the up-flow connecting portion 91b and flows upwards. Thus, by providing the up-flow connecting portion 91b, a non-uniform flow of the coolant water to a part of the upper cooling portion 91a can be prevented, and thereby, it is possible to cool the entire power module 20 uniformly.

As shown in FIG. 7, heat sinks 20a formed of a plurality of heat releasing pins (heat releasing fins) are provided on a lower surface of the power module 20 so as to project out. The coolant water flowing through the upper cooling portion 91a is brought into contact with the lower surface of the power module 20 and the heat sinks 20a and cools the power module 20 directly. In addition, the coolant water that has been introduced from the supply flow channel 94 is supplied first to the power-module cooling portion 91. Thus, the coolant water flows through the power-module cooling portion 91 in a state having the lowest temperature in the coolant-water flow channel 4. With such a configuration, it is possible to efficiently cool the power module 20 that generates the greatest amount of heat in the power converter 1.

As shown in FIGS. 5 and 6, the flowing direction of the coolant water introduced from the power-module cooling portion 91 to the DC/DC-converter cooling portion 92 is changed via the first connecting portion 96 and turned to the opposite direction. With such a configuration, the flow direction of the coolant water in the power-module cooling portion 91 and the flow direction of the coolant water in the DC/DC-converter cooling portion 92 are opposed to each other.

The DC/DC-converter cooling portion 92 is partitioned into a plurality of (seven) parallel flow channels 92b by a plurality of (six) ribs 92a formed along the flow direction of the coolant water. Here, the flow-channel cross-sectional area of the DC/DC-converter cooling portion 92 is the cross-sectional area of the flow channel through which the coolant water for cooling the DC/DC converter 30 flows and is the total cross-sectional area of all of the parallel flow channels 92b.

The ribs 92a are formed such that the longer the distance from the power-module cooling portion 91 is, the longer the length of a portion facing the first connecting portion 96 becomes. With such a configuration, the non-uniform flow of the coolant water, such as a situation in which the coolant water is introduced only to the front side parallel flow channels 92b, for example, is prevented, and it is possible to introduce the coolant water to all of the parallel flow channels 92b. In other words, a rectifying portion 98 for introducing the coolant water evenly to the DC/DC-converter cooling portion 92 is formed by the portion of the ribs 92a facing the first connecting portion 96 together with a step portion 96a, which will be described later.

The first connecting portion 96 is provided with the step portion 96a that guides the coolant water being introduced from the power-module cooling portion 91 to the DC/DC-converter cooling portion 92 towards the parallel flow channel 92b close to the power-module cooling portion 91 among the plurality of parallel flow channels 92b. With such a configuration, the non-uniform flow of the coolant water to the back side in the DC/DC-converter cooling portion 92 is prevented. In addition, at least one of the ribs 92a has a bump portion 92c that protrudes into the parallel flow channels 92b so as to reduce the flow-channel cross-sectional area. With such a configuration, because the non-uniform flow of the coolant water is further prevented in the DC/DC-converter cooling portion 92, it is possible to cool the entire DC/DC converter 30 uniformly.

In this embodiment, the bump portions 92c are provided in the parallel flow channels 92b to which the coolant water tends to be introduced among the plurality of parallel flow channels 92b. In this embodiment, the bump portions 92c are respectively provided in the parallel flow channel 92b positioned at the most front side in the flow direction of the coolant water and in second parallel flow channel 92b from the most back side in the flow direction of the coolant water. The positions where the bump portions 92c are provided are appropriately set in accordance with non-uniformness of the flow of the coolant water in the plurality of parallel flow channels 92b.

Figure 9:
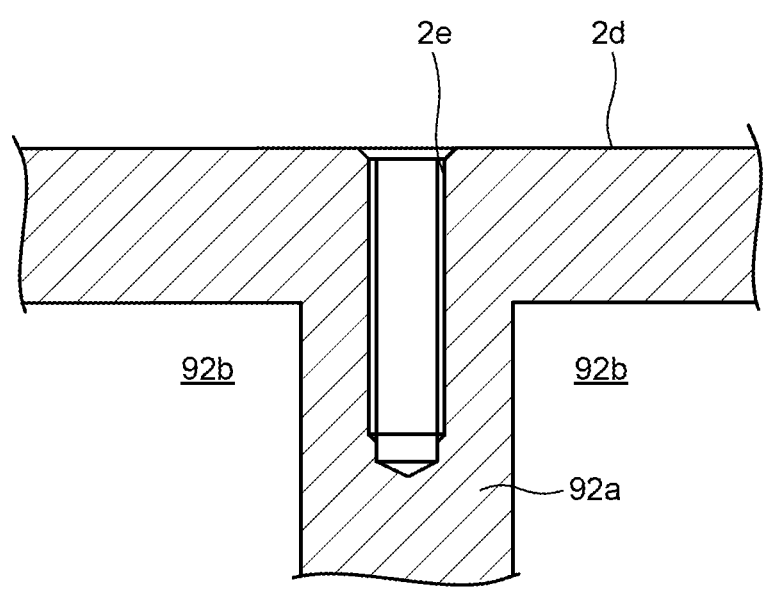
FIG. 9 is a diagram for explaining a screw hole formed in a rib, and is a sectional view taken along the line IX-IX in FIG. 6.

As shown in FIG. 9, the ribs 92a are formed with screw holes 2e for fastening the components in the case 2. With such a configuration, even if the thickness of the bottom portion 2c of the case 2 is made thinner due to the presence of the coolant-water flow channel 4, it is possible to secure a sufficient length for the screw holes 2e. The positions of the screw holes 2e are not limited to those shown in FIG. 6, and depending on the arrangement of the components in the case 2, the screw holes 2e are formed at other positions on the ribs 92a of the DC/DC-converter cooling portion 92 and at the positions where ribs 93c and 93f of the charger cooling portion 93, which will be described later, are provided.

As shown in FIGS. 5 and 6, the charger cooling portion 93 has first flow channel portions 93a that change, via the second connecting portion 97, the flowing direction of the coolant water introduced from the DC/DC-converter cooling portion 92 to the charger cooling portion 93 and turn it into the opposite direction and second flow channel portions 93b that further turn the flowing direction of the coolant water into the opposite direction from the first flow channel portions 93a towards the discharge flow channel 95. And so, the flow direction of the coolant water in the DC/DC-converter cooling portion 92 and the flow direction of the coolant water in the first flow channel portions 93a are opposed to each other. In addition, the flow direction of the coolant water in the first flow channel portions 93a and the flow direction of the coolant water in the second flow channel portions 93b are opposed to each other. As described above, by turning the flowing direction of the coolant water, it is possible to increase the proportion of the area for cooling the respective components with the coolant water in the limited area of the cooling surface 2d and to make the flow channel length longer. Here, the flow-channel cross-sectional area of the charger cooling portion 93 is the cross-sectional area of the flow channel through which the coolant water for cooling the charger 40 flows and is the cross-sectional area of the first flow channel portions 93a or the second flow channel portions 93b.

The first flow channel portions 93a and the second flow channel portions 93b are respectively formed along the arrangement of electronic components 40a (see FIG. 8) that are installed on the charger 40 and generate large amount of heat. The first flow channel portions 93a are partitioned into a plurality of (three) parallel flow channels 93d by the plurality of (two) ribs 93c formed along the flow direction of the coolant water. Similarly, the second flow channel portions 93b are partitioned into a plurality of (four) parallel flow channels 93g by the plurality of (three) ribs 93f formed along the flow direction of the coolant water. With such a configuration, because the non-uniform flow of the coolant water in the charger cooling portion 93 is prevented, it is possible to cool the entire charger 40 uniformly.

Among the plurality of parallel flow channels 93d in the first flow channel portions 93a, the parallel flow channel 93d positioned at the most upstream side in the flow direction of the coolant water is a deep flow channel 93e that causes the cooling surface 2d of the case 2 to project into the case 2. Similarly, among the plurality of parallel flow channels 93g in the second flow channel portions 93b, the parallel flow channel 93g positioned at the most downstream side in the flow direction of the coolant water is a deep flow channel 93h that causes the cooling surface 2d of the case 2 to project into the case 2. By providing the deep flow channels 93e and 93h as described above, it is possible to allow the coolant water to flow in the vicinity of electronic components 40b arranged at high positions of the charger 40 (see FIG. 8), and it is possible to cool the electronic components 40b.

In addition, in the second connecting portion 97, a step portion 97a that guides the coolant water being introduced from the DC/DC-converter cooling portion 92 to the charger cooling portion 93 towards the deep flow channel 93e of the first flow channel portions 93a. With such a configuration, because the non-uniform flow of the coolant water in the charger cooling portion 93 is further prevented, it is possible to cool the entire charger 40 uniformly.

In addition, because the second flow channel portions 93b are turned in the opposite direction from the first flow channel portions 93a, it is possible to form the supply flow channel 94 and the discharge flow channel 95 on the same side surface of the case 2. Thus, because the respective distances from the supply flow channel 94 and the discharge flow channel 95 to the sub-radiator 8 can be made shorter, it is possible to supply/discharge the coolant water through short circulation flow channel 7.

According to the embodiment mentioned above, the advantages described below are afforded.

The power module 20 and the charger 40 are arranged on the single coolant-water flow channel 4. However, the power module 20 is operated when the vehicle is driven, and in contrast, the charger 40 is operated when the vehicle is stopped. And so, a situation in which the power module 20 and the charger 40 are operated at the same time and their temperatures become so high that cooling thereof is required is avoided. Thus, a situation in which the coolant water for cooling the charger 40 has already been heated to high temperature by the cooling of the power module 20 is avoided. Therefore, because both the power module 20 and the charger 40 can be cooled by the coolant water flowing through the same coolant-water flow channel 4, it is possible to cool the power converter 1 with the coolant-water flow channel 4 having a simple configuration.

In addition, the DC/DC converter 30 is also arranged on the same coolant-water flow channel 4 as that used to cool the power module 20 and the charger 40. Although the DC/DC converter 30 is operated at the same time as the power module 20 and the charger 40, the amount of heat generated by the DC/DC converter 30 is smaller than those generated by the power module 20 and the charger 40. Thus, even when the DC/DC converter 30 is arranged on the same coolant-water flow channel 4 as that used to cool the power module 20 and the charger 40, the cooling efficiency of the power converter 1 is not affected.

In addition, in the coolant-water flow channel 4, the flow-channel cross-sectional areas of the portion for cooling the DC/DC converter 30 and the portion for cooling the charger 40 are larger than that of the portion for cooling the power module 20. And so, in the coolant-water flow channel 4, the flow speed of the coolant water in the portion for cooling the power module 20 is increased, and the flow speeds of the coolant water in the portion for cooling the DC/DC converter 30 and the portion for cooling the charger 40 are reduced. As a result, while cooling the power module 20 with reliability, it is possible to suppress the increase in pressure loss at a portion in which the flow speed of the coolant water is slow. Therefore, in a case in which a plurality of devices are cooled with the same coolant water, it is possible to suppress pressure loss while ensuring cooling capacity.

Embodiments of this invention were described above, but the above embodiments are merely examples of applications of this invention, and the technical scope of this invention is not limited to the specific constitutions of the above embodiments.

For example, instead of a mode of arrangement of the power module 20, the DC/DC converter 30, the charger 40, and the capacitor module 10 in the above-mentioned embodiment, a first to fifth modifications described below may be employed.

Figure 10:
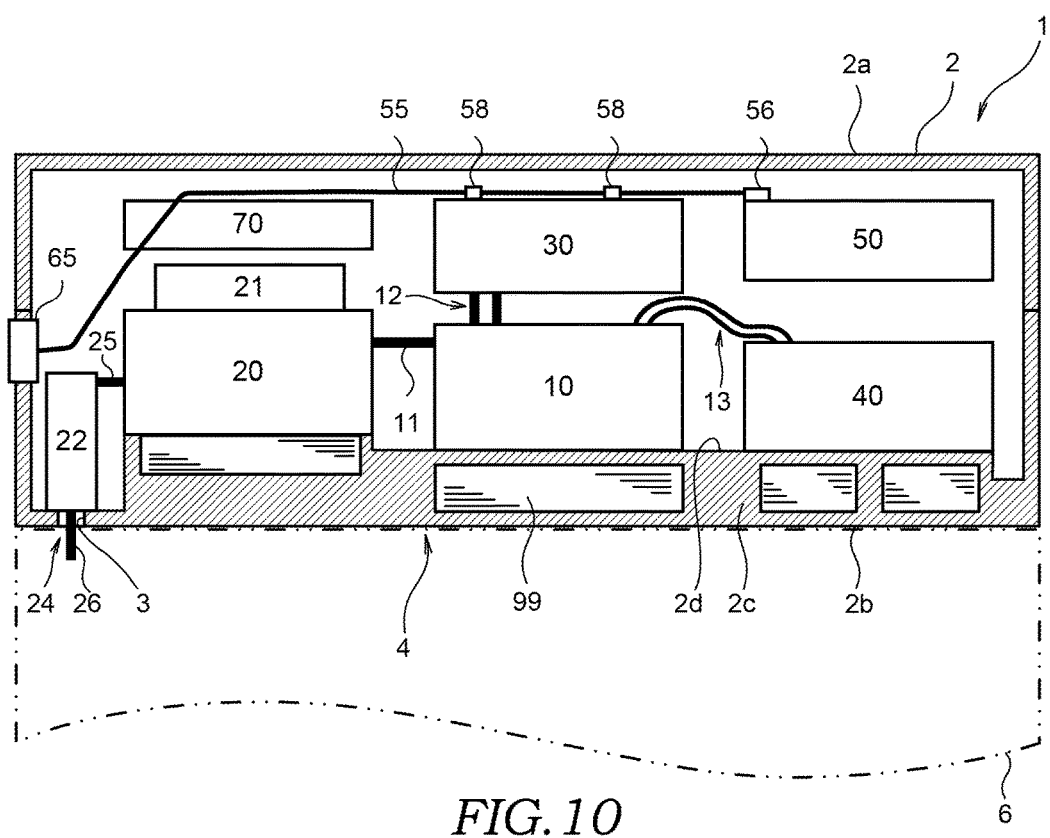
FIG. 10 is a sectional view viewed from the side for explaining the configuration of the power converter according to a first modification of the embodiment of the present invention.

In a first modification shown in FIG. 10, the capacitor module 10 is arranged on the cooling surface 2d of the case 2, and the DC/DC converter 30 is arranged on the capacitor module 10. In this case, the capacitor module 10 corresponds to the low-heat-generating electrical device. In addition, together with the charger cooling portion 93, a capacitor module cooling portion 99 (the second cooling portion) that cools the capacitor module 10 corresponds to the low-heat-generating-electrical-device cooling portion.

In addition, the DC/DC converter 30 and the capacitor module 10 may be arranged side-by-side on the cooling surface 2d of the case 2. In this case, both of the DC/DC converter 30 and the capacitor module 10 correspond to the low-heat-generating electrical devices, and both of the DC/DC-converter cooling portion 92 and the capacitor module cooling portion 99 correspond to the low-heat-generating-electrical-device cooling portions.

As described above, according to the first modification, similarly to the above-mentioned embodiment, while cooling the power module 20 with reliability, it is possible to suppress the increase in pressure loss at a portion in which the flow speed of the coolant water is slow. Therefore, in a case in which a plurality of devices are cooled with the same coolant water, it is possible to suppress pressure loss while ensuring cooling capacity.

Figure 11:
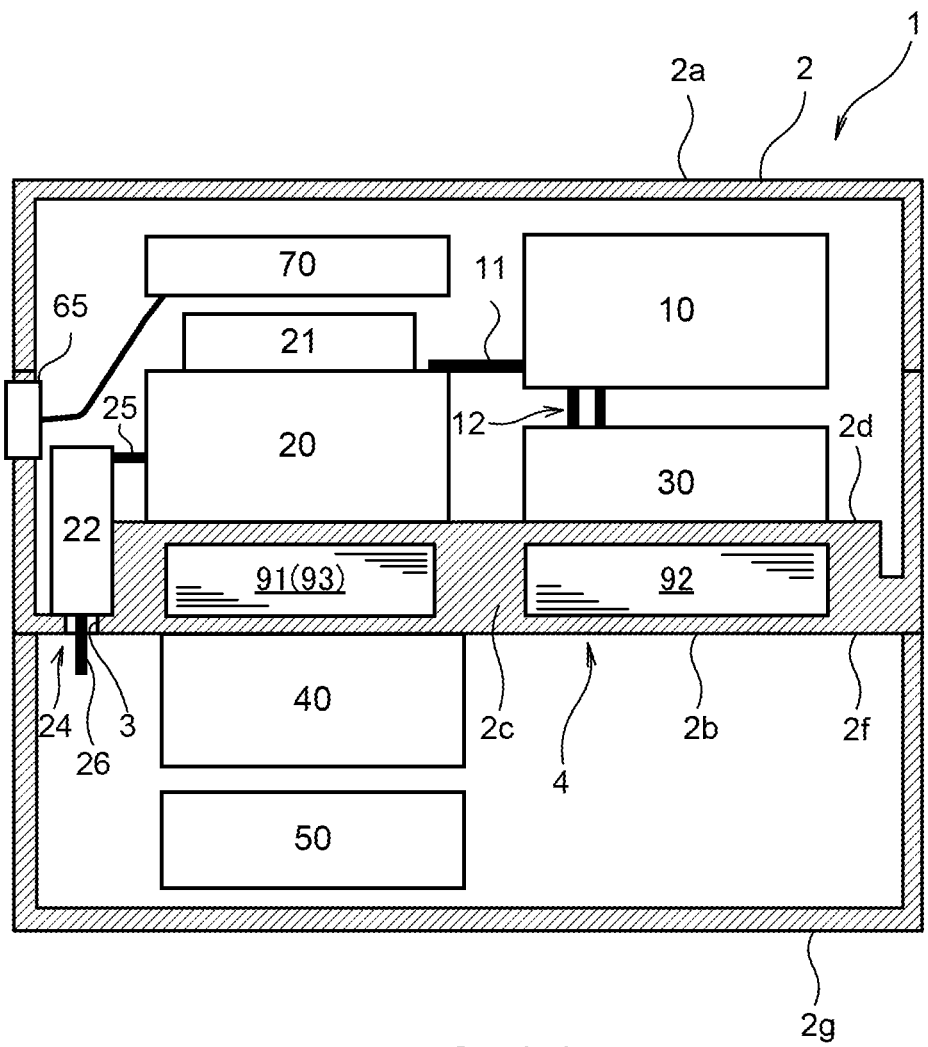
FIG. 11 is a sectional view viewed from the side for explaining the configuration of the power converter according to a second modification of the embodiment of the present invention.

In a second modification shown in FIG. 11, another cooling surface 2f is formed on the lower surface of the cooling surface 2d of the case 2, the power module 20 and the DC/DC converter 30 are arranged on the cooling surface 2d, and the charger 40 is arranged on the cooling surface 2f. In addition, the case 2 has a lower cover 2g that is provided on the further lower side of the bottom case 2b and accommodates the charger 40 and the DC/DC charge controller 50.

Here, as described above, the power module 20 and the charger 40 are not operated at the same time. In addition, the amount of heat generated during the operation of the DC/DC converter 30 is smaller than that generated during the operation of the power module 20 and the charger 40. In this modification, the power-module cooling portion 91 that cools the power module 20 also serves as the charger cooling portion 93 that cools the charger 40, and the flow-channel cross-sectional area thereof is smaller than that of the DC/DC-converter cooling portion 92. In addition, because the amount of heat generated by the power module 20 is larger than that generated by the charger 40, the flow speed of the coolant water in the power-module cooling portion 91 is set to the flow speed required to cool the power module 20.

As described above, according to second modification, while cooling the power module 20 and the charger 40 with reliability, it is possible to suppress the increase in pressure loss at a portion in which the flow speed of the coolant water is slow. Therefore, in a case in which a plurality of devices are cooled with the same coolant water, it is possible to suppress pressure loss while ensuring cooling capacity. The DC/DC converter 30 may be arranged side-by-side with the charger 40 on the cooling surface 2f instead of being arranged side-by-side with the power module 20 on the cooling surface 2d.

Figure 12:
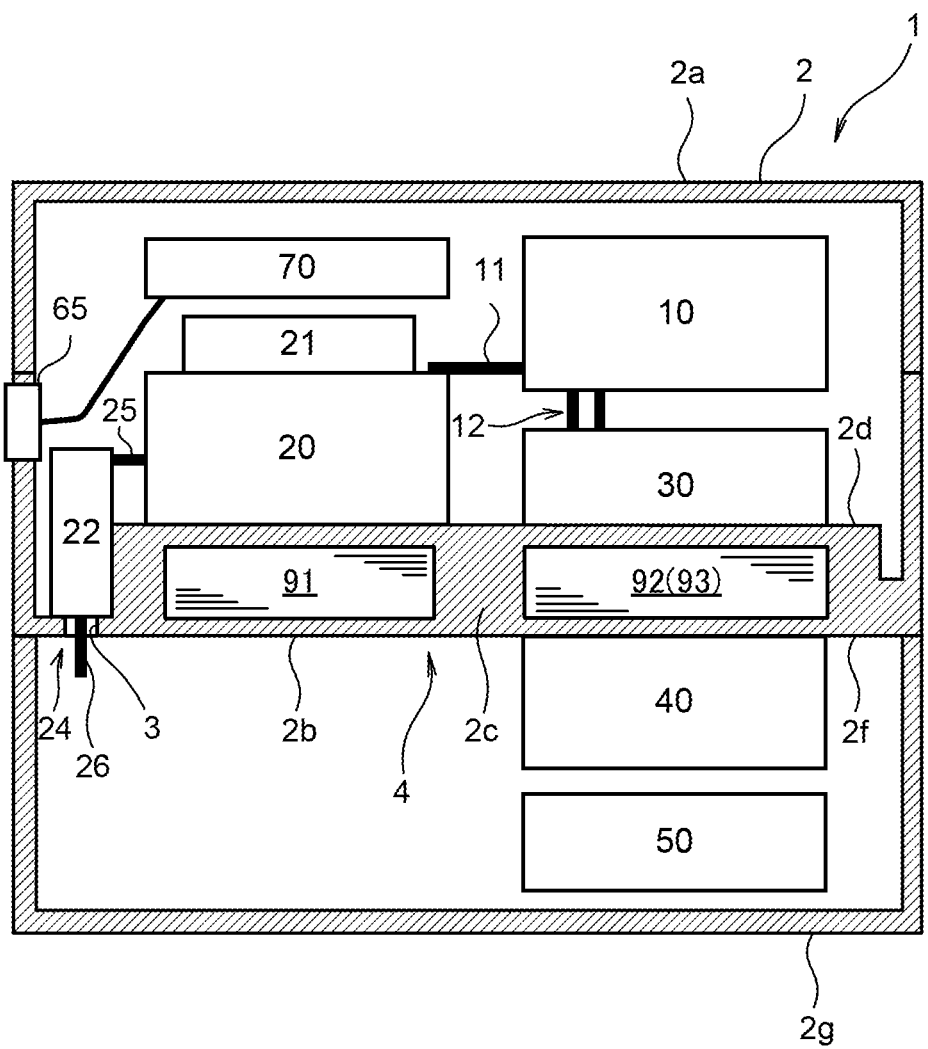
FIG. 12 is a sectional view viewed from the side for explaining the configuration of the power converter according to a third modification of the embodiment of the present invention.

In a third modification shown in FIG. 12, the other cooling surface 2f is formed on the lower side of the cooling surface 2d of the case 2, the power module 20 and the DC/DC converter 30 are arranged on the cooling surface 2d, and the charger 40 is arranged on the cooling surface 2f. In addition, the case 2 has the lower cover 2g that is provided on the further lower side of the bottom case 2b and accommodates the charger 40 and DC/DC controller 50.

In this modification, the DC/DC-converter cooling portion 92 also serves as the charger cooling portion 93 that cools the charger 40, and the flow-channel cross-sectional area thereof is larger than that of the power-module cooling portion 91. In addition, because the amount of heat generated by the charger 40 is larger than that generated by the DC/DC converter 30, the flow speed of the coolant water in the DC/DC-converter cooling portion 92 is set to the flow speed required to cool the charger 40.

As described above, according to the third modification, while cooling the power module 20 with reliability, it is possible to suppress the increase in pressure loss at a portion in which the flow speed of the coolant water is slow. Therefore, in a case in which a plurality of devices are cooled with the same coolant water, it is possible to suppress pressure loss while ensuring cooling capacity.

Figure 13:
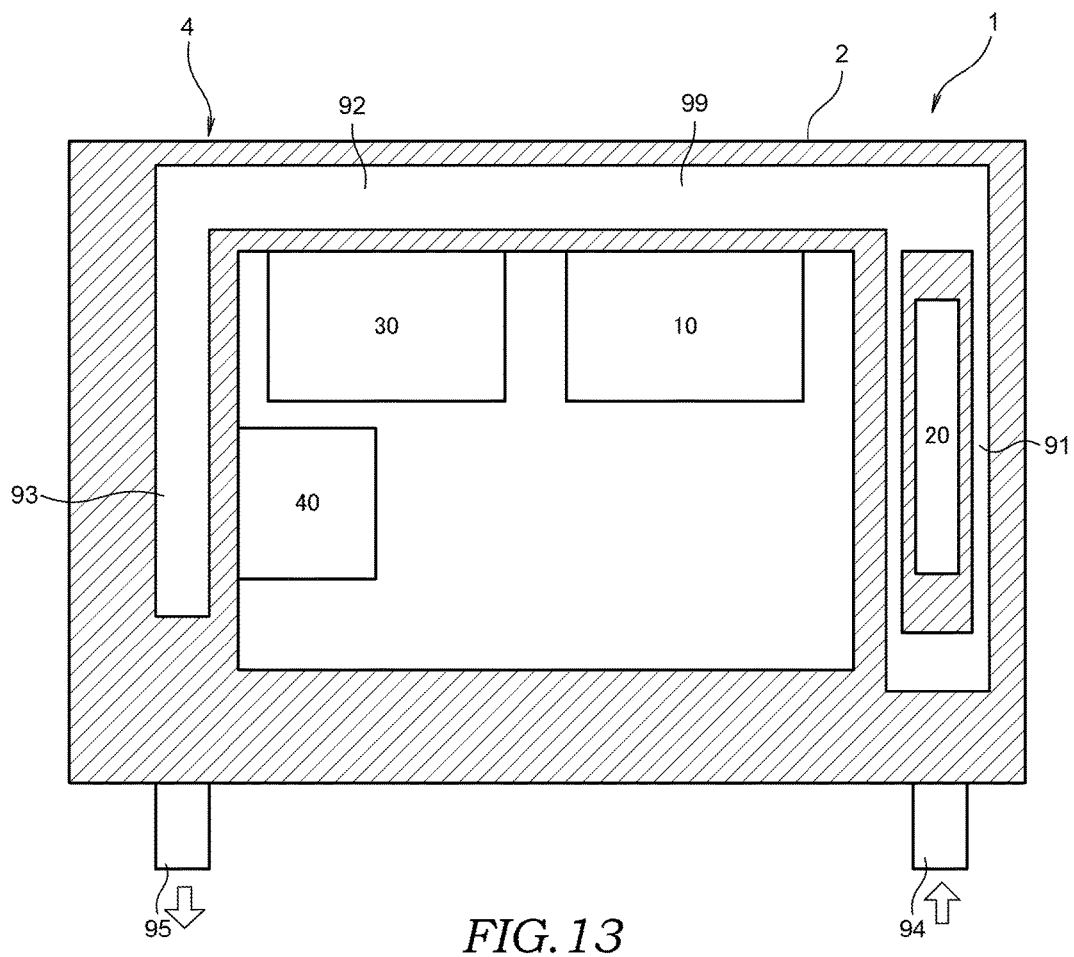
FIG. 13 is a sectional view in a horizontal plane for explaining the configuration of the power converter according to a fourth modification of the embodiment of the present invention.

In a fourth modification shown in FIG. 13, the coolant-water flow channel 4 is formed such that the coolant water that has been introduced from the supply flow channel 94 is guided in a U-shape and flows out from the discharge flow channel 95. The coolant-water flow channel 4 is provided with the power-module cooling portion 91 that cools the power module 20, the capacitor module cooling portion 99 that cools the capacitor module 10, the DC/DC-converter cooling portion 92 that cools the DC/DC converter 30, and the charger cooling portion 93 that cools the charger 40 in this order from the upstream side.

In this modification, the flow-channel cross-sectional area of the power-module cooling portion 91 is the smallest, and the flow-channel cross-sectional areas of the capacitor module cooling portion 99 and the DC/DC-converter cooling portion 92 are the largest. In addition, the flow-channel cross-sectional area of the charger cooling portion 93 is larger than that of the power-module cooling portion 91, but is smaller than those of the capacitor module cooling portion 99 and the DC/DC-converter cooling portion 92.

As described above, according to the fourth modification, while cooling the power module 20 with reliability, it is possible to suppress the increase in pressure loss at a portion in which the flow speed of the coolant water is slow. Therefore, in a case in which a plurality of devices are cooled with the same coolant water, it is possible to suppress pressure loss while ensuring cooling capacity.

Figure 14:
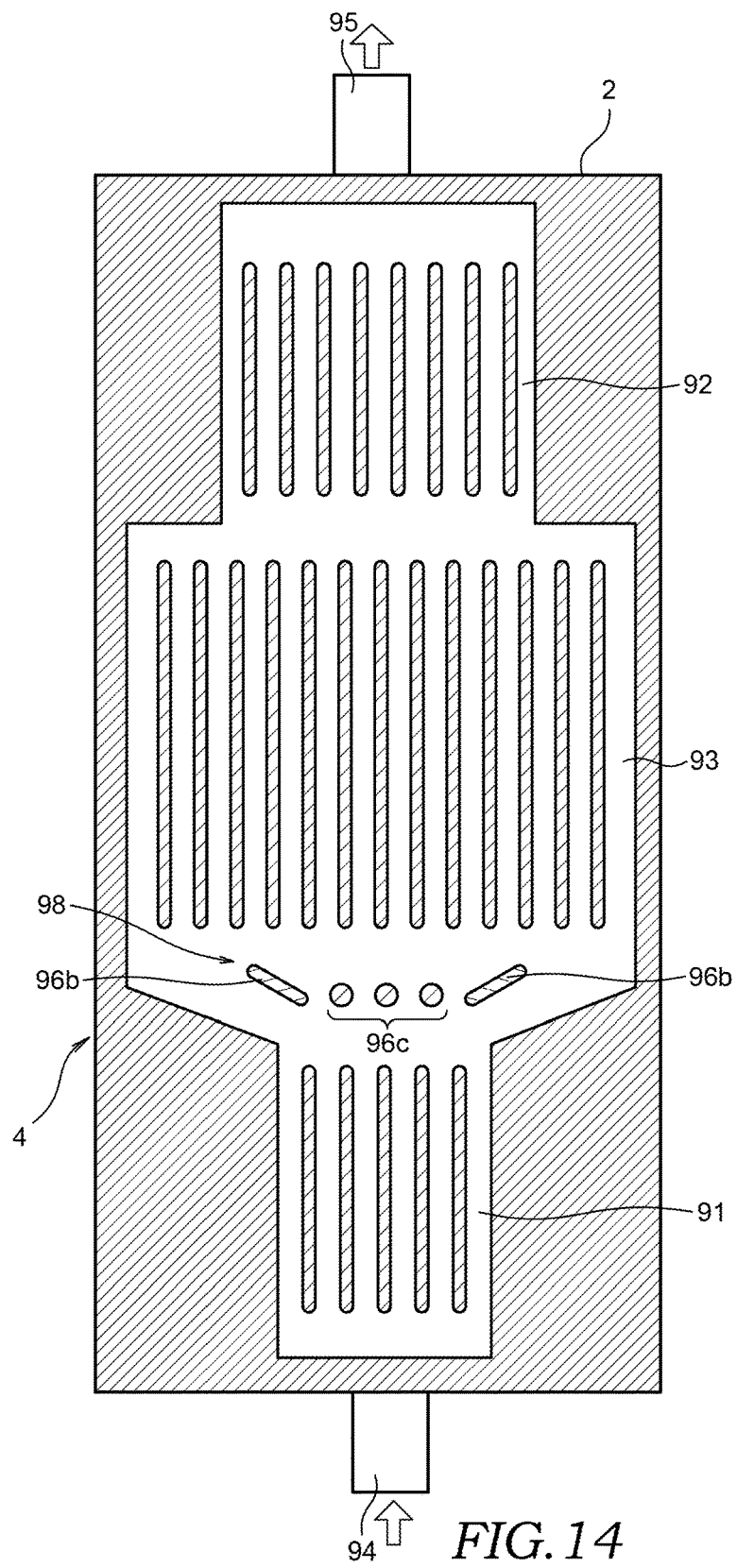
FIG. 14 is a sectional view in a horizontal plane for explaining the configuration of the cooling-medium flow channel of the power converter according to a fifth modification of the embodiment of the present invention.

In a fifth modification shown in FIG. 14, the coolant-water flow channel 4 is formed such that the coolant water that has been introduced from the supply flow channel 94 is guided in a straight line and flows out from the discharge flow channel 95. The coolant-water flow channel 4 is provided with the power-module cooling portion 91 that cools the power module 20, the DC/DC-converter cooling portion 92 that cools the DC/DC converter 30, and the charger cooling portion 93 that cools the charger 40 in this order from the upstream side.

Ribs 96b and pins 96c for uniformly introducing the coolant water to the DC/DC-converter cooling portion 92 are provided between the power-module cooling portion 91 and the DC/DC-converter cooling portion 92. The ribs 96b and the pins 96c correspond to the rectifying portions 98.

In this modification, the flow-channel cross-sectional area of the power-module cooling portion 91 is the smallest, and the flow-channel cross-sectional area of the DC/DC-converter cooling portion 92 is the largest. In addition, the flow-channel cross-sectional area of the charger cooling portion 93 is larger than that of the power-module cooling portion 91, but is smaller than that of the DC/DC-converter cooling portion 92.

As described above, according to the fifth modification, while cooling the power module 20 with reliability, it is possible to suppress the increase in pressure loss at a portion in which the flow speed of the coolant water is slow. Therefore, in a case in which a plurality of devices are cooled with the same coolant water, it is possible to suppress pressure loss while ensuring cooling capacity.

Representative features of the present invention other than those described in the claims include followings.

(1) The power converter mounted on an electric vehicle including: the first power conversion device that convert electrical power when the electric vehicle is driven and generates heat; the low-heat-generating electrical device that generates heat so as to become mild temperature as compared to the first power conversion device; the case that has a mounting portion that is provided with the first power conversion device and the low-heat-generating electrical device; and the cooling-medium flow channel that is formed in the mounting portion and through which the cooling medium flows, wherein in the cooling-medium flow channel, the flow-channel cross-sectional area of a portion for cooling the low-heat-generating electrical device is larger than that of a portion for cooling the first power conversion device.

(2) The power converter according to (1), wherein the low-heat-generating electrical device is at least one of the second power conversion device that is provided separately from the first power conversion device and that generates heat by converting electrical power; and the smoothing capacitor that smoothes electrical power.

(3) The power converter according to (1) or (2), wherein the cooling-medium flow channel is formed such that the cooling medium cools the low-heat-generating electrical device after cooling the first power conversion device.

(4) The power converter according to any one of (1) to (3), wherein the cooling-medium flow channel has a rectifying portion that is formed such that the cooling medium is introduced uniformly from the portion for cooling the first power conversion device to a portion for cooling the low-heat-generating electrical device.

(5) The power converter according to any one of (1) to (3), wherein the cooling-medium flow channel has: the first-power-conversion-device cooling portion that cools the first power conversion device; the low-heat-generating-electrical-device cooling portion that changes the flowing direction of the cooling medium introduced from the first-power-conversion-device cooling portion and that cools the low-heat-generating electrical device; and a connecting flow channel that connects the first-power-conversion-device cooling portion and the low-heat-generating-electrical-device cooling portion, wherein the low-heat-generating-electrical-device cooling portion has a plurality of ribs that partition a plurality of parallel flow channels, and the plurality of ribs are formed such that the longer the distance from the first-power-conversion-device cooling portion is, the longer the length of a portion facing the connecting flow channel becomes.

(6) The power converter that convert electrical power between the power storage apparatus and the load including: the first power conversion device that converts direct-current electric power from the power storage apparatus and alternating-current electrical power to be supplied to the load; the smoothing capacitor that smoothes electrical power between the first power conversion device and the power storage apparatus; the second power conversion device that converts direct-current voltage supplied from the power storage apparatus or that converts alternating-current electrical power supplied via the external connector to direct-current electric power; the case that accommodates the first power conversion device, the smoothing capacitor, and the second power conversion device; and the cooling-medium flow channel through which the cooling medium flows and that is provided in the case so as to cool the first power conversion device and at least one of the smoothing capacitor and the second power conversion device, wherein the cooling-medium flow channel has the first cooling portion that cools the first power conversion device and the second cooling portion that cools at least one of the smoothing capacitor and the second power conversion device after cooling the first power conversion device, and wherein the flow speed of the cooling medium in the second cooling portion is slower than the flow speed of the cooling medium in the first cooling portion.

(7) The power converter according to (6), wherein the second cooling portion has a plurality of ribs that partition a plurality of parallel flow channels.

(8) The power converter according to (7), wherein at least one of the plurality of ribs has a bump portion that protrudes into the parallel flow channels so as to reduce the flow-channel cross-sectional area.

(9) The power converter according to (7) or (8), wherein the cooling-medium flow channel further has a step portion that guides the cooling medium that is introduced from the first cooling portion to the second cooling portion towards the parallel flow channel close to the first cooling portion among the plurality of parallel flow channels.

(10) The power converter according to any one of (7) to (9), wherein the ribs are formed with a screw hole for fastening components in the case.

(11) The power converter according to any one of (6) to (10), wherein: the second power conversion device has the DC/DC converter that converts direct-current voltage supplied from the power storage apparatus and the charger that is accommodated in the case, that converts alternating-current electrical power supplied via the external connector to direct-current electric power, and that charges the power storage apparatus therewith; the second cooling portion cools the DC/DC converter; and the cooling-medium flow channel further has the third cooling portion that cools the charger after cooling the DC/DC converter.

(12) The power converter according to (11), wherein: the third cooling portion has the plurality of ribs that partition the plurality of parallel flow channels; and the parallel flow channel positioned at the most upstream side in the flow direction of the cooling medium among the plurality of parallel flow channels in the third cooling portion is the deep flow channel that causes the cooling surface provided on a wall portion of the case in contact with the charger to project into the case.

(13) The power converter according to (12), wherein the cooling-medium flow channel further has the step portion that guides the cooling medium introduced from the second cooling portion to the third cooling portion towards the deep flow channel.

(14) The power converter mounted on an electric vehicle including: the first power conversion device that convert electrical power when the electric vehicle is driven and generates heat; the low-heat-generating electrical device that generates heat so as to become mild temperature as compared to the first power conversion device; the case that has a mounting portion that is provided with the first power conversion device and the low-heat-generating electrical device; and the cooling-medium flow channel that is formed in the mounting portion and through which the cooling medium flows, wherein the flow speed of the cooling medium in the cooling-medium flow channel is slower in the portion for cooling the low-heat-generating electrical device than that in the portion for cooling the first power conversion device, and the low-heat-generating electrical device is the smoothing capacitor that smoothes electrical power or the second power conversion device that is provided separately from the first power conversion device and that generates heat by converting electrical power.

This application claims priority based on Japanese Patent Application No. 2015-101035 filed with the Japan Patent Office on May 18, 2015 and Japanese Patent Application No. 2016-089218 filed with the Japan Patent Office on Apr. 27, 2016, the entire contents of which are incorporated into this specification.

The invention claimed is:

1. A power converter for converting electrical power between a power storage apparatus and a load, comprising:
   a power module configured to convert mutually direct-current electric power from the power storage apparatus and alternating-current electrical power from the load;
   a charger configured to convert external alternating-current electrical power to direct-current electric power, the charger being configured to charge the power storage apparatus therewith, and the external alternating-current electrical power being supplied via an external connector;
   a DC/DC converter provided between the power module and the charger, the DC/DC converter being configured to convert direct-current voltage supplied from the power storage apparatus;
   a case configured to accommodate the power module, the DC/DC converter, and the charger; and
   a cooling-medium flow channel structured to permit cooling medium to flow through the cooling-medium flow channel, the cooling-medium flow channel being provided in the case,
   wherein the power module, the DC/DC converter, and the charger are arranged on the cooling-medium flow channel, which is structured such that the cooling medium flowing through the cooling-medium flow channel cools the power module, the DC/DC converter, and the charger in this order.

2. A power converter for converting electrical power between a power storage apparatus and a load comprising:
   a power module configured to convert mutually direct-current electric power from the power storage apparatus and alternating-current electrical power from the load;
   a charger configured to convert external alternating-current electrical power to direct-current electric power, the charger being configured to charge the power storage apparatus therewith, and the external alternating-current electrical power being supplied via an external connector;
   a capacitor module provided between the power module and the charger, the capacitor module being connected to the power module and the charger;
   a case configured to accommodate the power module, the capacitor module, and the charger; and
   a cooling-medium flow channel structured to permit cooling medium to flow through the cooling-medium flow channel, the cooling-medium flow channel being provided in the case,
   wherein the power module, the capacitor module, and the charger are arranged on the cooling-medium flow channel, which is structured such that the cooling medium flowing through the cooling-medium flow channel cools the power module, the capacitor module, and the charger in this order.

3. The power converter according to claim 1, wherein the cooling-medium flow channel includes:
   a power-module cooling portion configured to cool the power module;
   a DC/DC-converter cooling portion configured to cool the DC/DC converter; and
   a charger cooling portion configured to cool the charger, and
   wherein the power-module cooling portion, the DC/DC-converter cooling portion, and the charger cooling portion are arranged in series in the cooling-medium flow channel.

4. The power converter according to claim 2, wherein the cooling-medium flow channel includes:
   a power-module cooling portion configured to cool the power module;
   a capacitor module cooling portion configured to cool the capacitor module; and
   a charger cooling portion configured to cool the charger, and
   wherein the power-module cooling portion, the capacitor module cooling portion, and the charger cooling portion are arranged in series in the cooling-medium flow channel.

5. The power converter according to claim 1, wherein the case is formed to have a box-shape having a bottom portion in which the power module, the DC/DC converter, and the charger are provided, and
   the cooling-medium flow channel is formed in the bottom portion.

6. The power converter according to claim 2, wherein the case is formed to have a box-shape having a bottom portion in which the power module, the capacitor module, and the charger are provided, and
   the cooling-medium flow channel is formed in the bottom portion.

7. The power converter according to claim 3, further comprising:
   a supply flow channel configured to supply the cooling medium to the power-module cooling portion from outside; and
   a discharge flow channel configured to discharge the cooling medium from the charger cooling portion to the outside.

8. The power converter according to claim 3, wherein the DC/DC-converter cooling portion has a larger flow-channel cross-sectional area than the power-module cooling portion.

9. The power converter according to claim 4, wherein the capacitor module cooling portion has a larger flow-channel cross-sectional area than the power-module cooling portion.

10. The power converter according to claim 3, wherein the cooling-medium flow channel includes a rectifying portion formed so as to introduce the cooling medium uniformly from the power-module cooling portion to the DC/DC-converter cooling portion.

11. The power converter according to claim 10, wherein the cooling-medium flow channel further includes a connecting flow channel configured to connect the power-module cooling portion and the DC/DC-converter cooling portion,
    the DC/DC-converter cooling portion has a plurality of ribs configured to partition a plurality of parallel flow channels, and
    the plurality of ribs are formed such that length of a portion facing the connecting flow channel becomes longer as a distance to the power-module cooling portion becomes longer.

12. The power converter according to claim 3, wherein a flow speed of the cooling medium in the DC/DC-converter cooling portion is slower than a flow speed of the cooling medium in the power-module cooling portion.

13. The power converter according to claim 12, wherein the DC/DC-converter cooling portion includes a plurality of ribs configured to partition a plurality of parallel flow channels.

14. The power converter according to claim 13, wherein at least one of the plurality of ribs includes a bump portion configured to protrude into at least one of the parallel flow channels so as to reduce a flow-channel cross-sectional area.

15. The power converter according to claim 13, wherein the cooling-medium flow channel further includes a step portion configured to guide the cooling medium towards one of the parallel flow channels of the plurality of parallel flow channels that is closer to the power-module cooling portion than another of the plurality of parallel flow channels, the cooling medium being introduced from the power-module cooling portion to the DC/DC-converter cooling portion.

16. The power converter according to claim 13, wherein a screw hole for fastening components in the case is formed in at least one rib of the plurality of ribs.

17. The power converter according to claim 10, wherein the charger cooling portion includes a plurality of ribs configured to partition a plurality of parallel flow channels, and
a parallel flow channel, which is positioned at a most upstream side in a flow direction of the cooling medium among the plurality of parallel flow channels in the charger cooling portion, is a flow channel configured to cause a cooling surface to project into the case, the cooling surface being provided on a wall portion of the case in contact with the charger.

18. The power converter according to claim 17, wherein the cooling-medium flow channel further includes a step portion configured to guide the cooling medium towards the flow channel, the cooling medium being introduced from the DC/DC-converter cooling portion to the charger cooling portion.

19. A power converter mounted on an electric vehicle comprising:
a power module configured to convert electrical power when the electric vehicle is driven;
a low-heat-generating electrical device configured such that amount of heat generated during operation is smaller than amount of heat generated by the power module;
a case configured to have a mounting portion on which the power module and the low-heat-generating electrical device are mounted; and
a cooling-medium flow channel structured to permit cooling medium to flow through the cooling-medium flow channel, the cooling-medium flow channel being formed in the mounting portion, wherein
the low-heat-generating electrical device includes at least one of a capacitor module, a charger, or a DC/DC converter, and
the cooling-medium flow channel is configured such that a portion for cooling the low-heat-generating electrical device has a larger flow-channel cross-sectional area than a portion for cooling the power module, the low-heat-generating electrical device being configured to be cooled by the cooling medium after the power module is cooled.

* * * * *